United States Patent
Joshi et al.

(10) Patent No.: US 7,751,267 B2
(45) Date of Patent: Jul. 6, 2010

(54) HALF-SELECT COMPLIANT MEMORY CELL PRECHARGE CIRCUIT

(75) Inventors: Rajiv V. Joshi, Yorktown Heights, NY (US); Rouwaida Kanj, Round Rock, TX (US); Jayakumaran Sivagnaname, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 11/782,071

(22) Filed: Jul. 24, 2007

(65) Prior Publication Data

US 2009/0027983 A1    Jan. 29, 2009

(51) Int. Cl.
  *G11C 7/12*  (2006.01)
  *G11C 11/41*  (2006.01)
  *G11C 11/413*  (2006.01)

(52) U.S. Cl. .................. 365/203; 365/154; 365/202; 365/206; 365/230.05

(58) Field of Classification Search .................. 365/203, 365/206, 154, 230.05, 185.25, 204, 202, 365/189.11, 189.09
See application file for complete search history.

(56) References Cited

U.S. PATENT DOCUMENTS 6,404,686 B1 *   6/2002   Aipperspach et al. ........ 365/205

OTHER PUBLICATIONS

A KIPO computer translation of KR 2002-0002681 (Korea, Jan. 10, 2002).*
A KIPO computer translation of 10-2007-0049838 (Korea, May 14, 2007).*

* cited by examiner

*Primary Examiner*—J. H. Hur
(74) *Attorney, Agent, or Firm*—Tutunjian & Bitetto, P.C.; Brian Verminski, Esq.

(57) ABSTRACT

A programmable precharge circuit includes a plurality of transistors. Each transistor has a different threshold voltage from other transistors of the plurality of transistors. Each transistor is configured to connect a supply voltage to a node, and the node is selectively coupled to bitlines in accordance with a memory operation. Control logic is configured to enable at least one of the plurality of transistors to provide a programmable precharge voltage to the node in accordance with a respective threshold voltage drop from the supply voltage of one of the plurality of transistors.

21 Claims, 6 Drawing Sheets

HALF-SELECT COMPLIANT MEMORY CELL PRECHARGE CIRCUIT

BACKGROUND

1. Technical Field

The present invention relates to integrated circuits and more particularly to a memory circuit with a programmable precharge circuit that reduces or eliminates half-select errors.

2. Description of the Related Art

Microprocessor yields can be determined by array yield parameters such as minimum voltage (Vmin), cell stability, and array performance. Different techniques have been proposed to improve the stability of static random access memory (SRAM) cells such as dynamic or dual cell power supplies based on read or write operations, usage of multi-threshold voltage (Vt) devices, or adding transistors to a six transistor (6T) SRAM cell.

An extension of this is the usage of an eight transistor (8T) cell where read and write ports are decoupled. However, the write port of an 8T SRAM suffers the same half select problems as that of 6T cells.

Referring to FIG. 1, prior art 6T SRAM cells 14 and 16 are illustratively shown. Cell 16 may suffer from a half select failure. Half select occurs when a wordline 12 is on while a column select is off. This leads to poor stability even when using fewer cells on bitlines 18 and 20. Due to the combination of active signals, the data in the cell may be partially or fully written to or discharged since the cell is half-selected (WL activates access transistors 30 even when the column is not selected).

Referring to FIG. 2, a 6T cell 40 is shown with a row selected while the column is not selected. A wordline (WL=1) is high and bitlines blc (bitline complement) and bit (bitline true) are clamped to the supply voltage VDD. In this case, charge may leak with respect to a memory cell portion 24, which employs a supply voltage VCS for transistors 26 and 28 of the cell 24. Access transistors 30 are employed to provide access to/from the bitlines (blc, blt) by the memory cell 24. When the cell 24 is not selected, VDD and Vcs, which have different values, cause a differential across access transistors 30. This results in current leakage to/from the memory cell 24 (half-select instability). Half-select occurs due to another internal '0' storage node sharing charge with the bitline at VDD, through an access transistor 30.

In the case of an 8T cell, read and write operations may be carried out using separate wordlines. However, the write port is similar to the 6T cell described and suffers from the half-select problem.

SUMMARY

A programmable precharge circuit includes a plurality of transistors. Each transistor has a different threshold voltage from other transistors of the plurality of transistors. Each transistor is configured to connect a supply voltage to a node, and the node is selectively coupled to bitlines in accordance with a memory operation. Control logic is configured to enable at least one of the plurality of transistors to provide a programmable precharge voltage to the node in accordance with a respective threshold voltage drop from the supply voltage of one of the plurality of transistors.

Another programmable precharge circuit includes a first transistor having a first threshold voltage configured to connect a supply voltage to a node, the node being selectively coupled to bitlines in accordance with a write operation. A second transistor has a second threshold voltage configured to connect the supply voltage to the node. The node being selectively coupled to the bitlines in accordance with the write operation. Control logic is configured to enable at least one of the first transistor and the second transistor to provide a programmable precharge voltage to the node in accordance with a respective threshold voltage drop from the supply voltage of one of the first and second threshold voltages.

A method for reducing half select errors in a memory device includes enabling at least one of a plurality of transistors to provide a programmable precharge voltage to a node in accordance with a threshold voltage drop from a supply voltage of a selected one of the plurality of transistors where each of the plurality of transistors includes a different threshold voltage, and selectively coupling the at least one of the plurality of transistors to bitlines in accordance with a memory operation to regulate a voltage on the bitlines to reduce half-select leakage in a memory cell.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
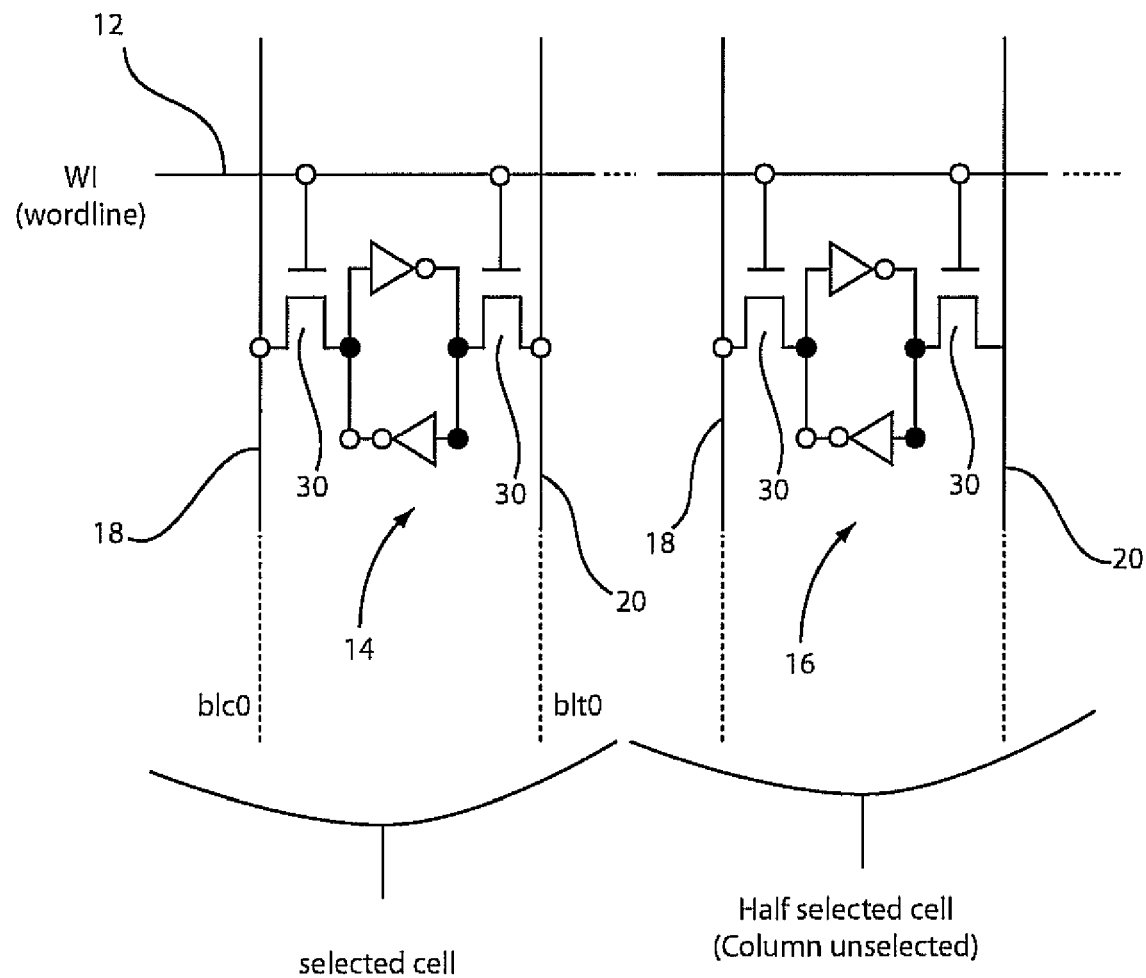
FIG. 1 is a prior art schematic diagram showing a selected column of cells and an unselected column of cells which is half selected due to the sharing of a wordline.
Figure 2:
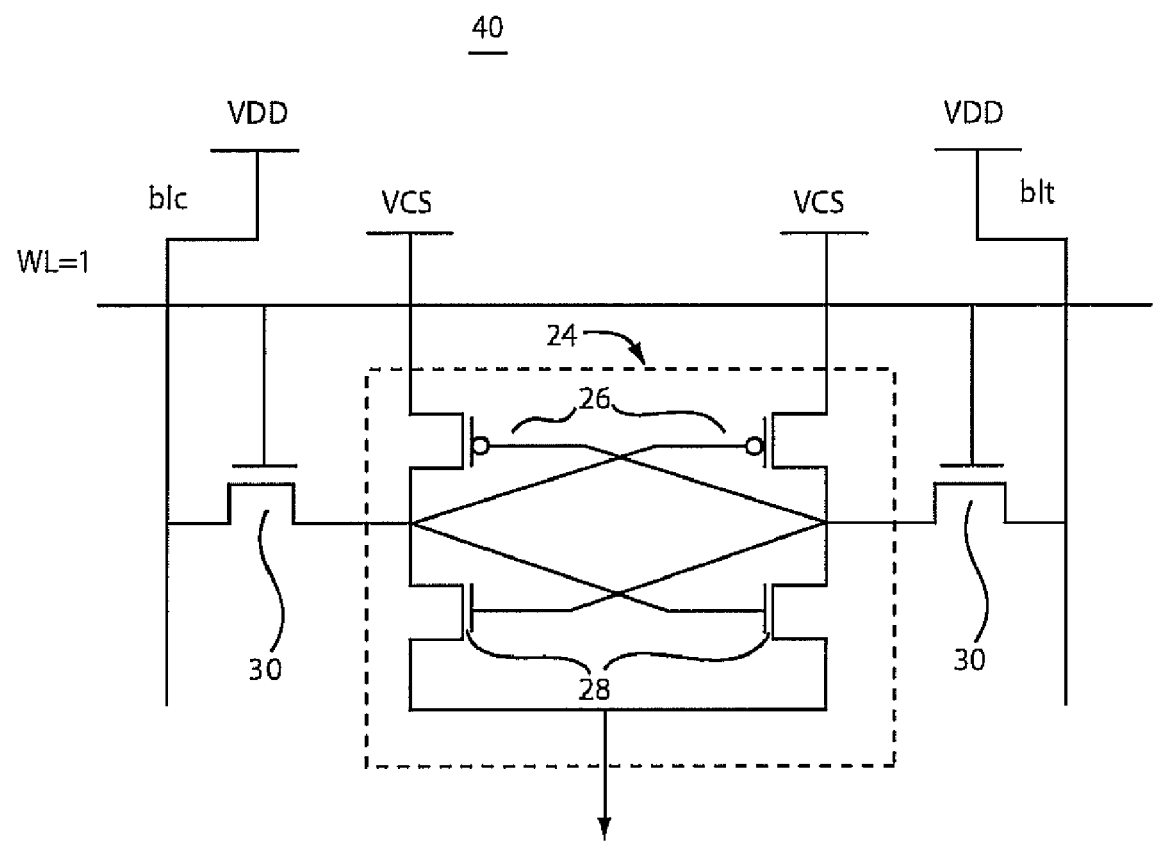
FIG. 2 is another prior art schematic diagram showing a memory cell with a selected row (WL=1) when the bitlines are connected to VDD.

Embodiments in accordance with the present principles include a memory cell and precharge circuit which reduce or eliminate half-select problems. The precharge circuit provides a voltage drop during the precharge to ensure that the voltage on bitlines is maintained at a particular level to reduce charge leakage to/from the memory cell during operations where half-select problem could otherwise normally occur. In one embodiment, the precharge circuit is programmable so that the voltage drop can be adjusted to a desired level. In one example, transistors with different threshold voltages are selectively enabled to permit a plurality of different voltage drops for use as bitline voltages.

Embodiments of the present invention can take the form of an entirely hardware embodiment, an entirely software embodiment or an embodiment including both hardware and software elements. In a preferred embodiment, the present invention is implemented in hardware, but versions of the circuit may be implemented in software which may include but are not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The circuit(s) as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
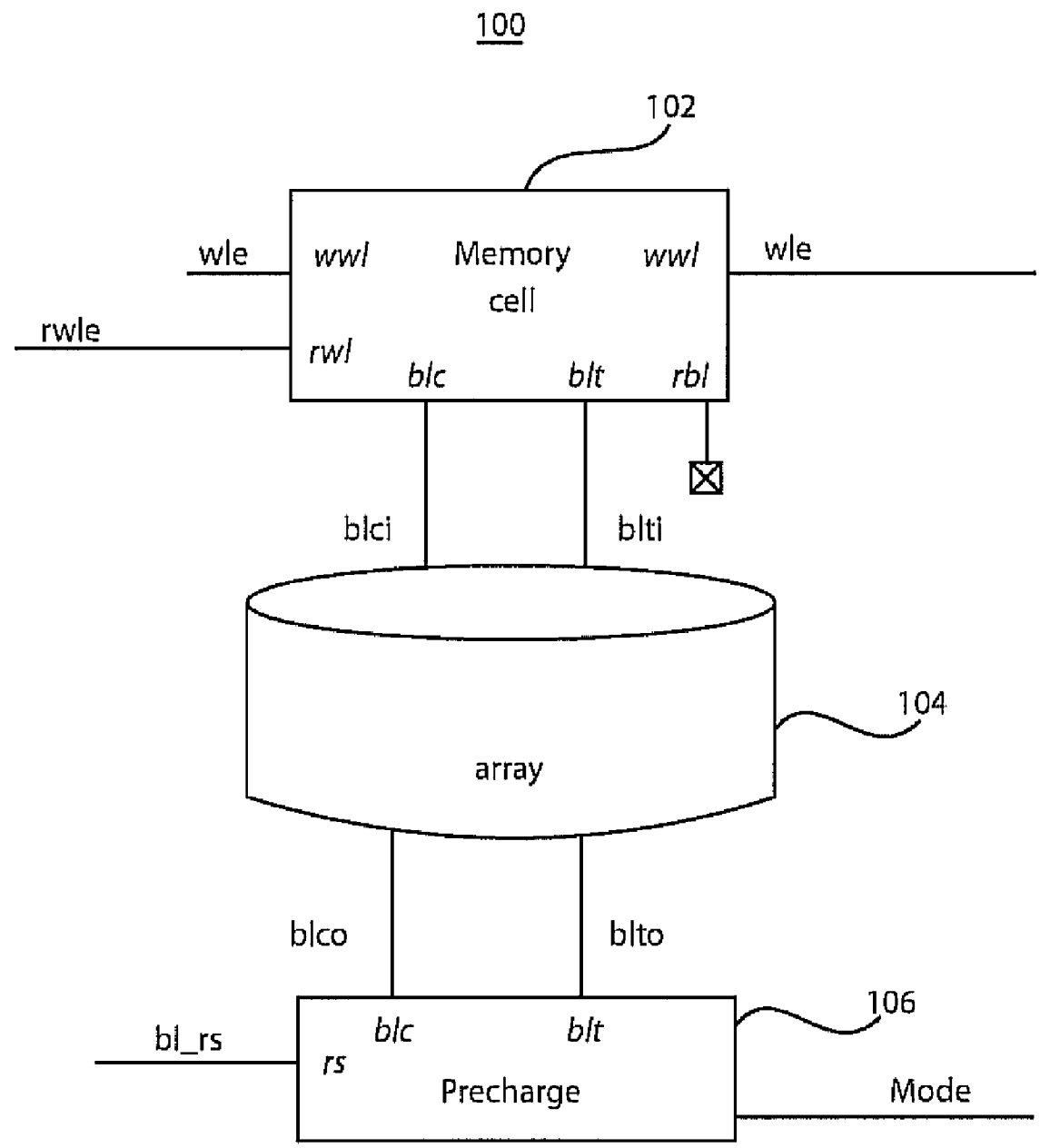
FIG. 3 is a schematic diagram of an exemplary column in a memory array of a memory device in accordance with the present principles.

Referring now to the drawings in which like numerals represent the same or similar elements and initially to FIG. 3, a schematic diagram shows an illustrative memory circuit 100. The memory circuit 100 includes a precharge circuit 106 configured to condition non-selected columns in the memory circuit 100. The precharge circuit 106 conditions the voltage on bitlines (blco and blto), which are coupled to local bitlines in an array 104 of memory cells. Local bitlines (blci and blti) are conditioned in accordance with the operations performed on a particular memory cell 102.

Precharge circuit 106 includes a mode input (mode) that may be generated in accordance with an independent control signal(s) or in accordance with an on-chip operation. The precharge circuit 106 further includes a reset signal (rs), which is employed to reset bitlines (blc and blt). Memory cell 102 may include any memory cell technology; however, in one preferred embodiment, cell 102 includes an 8T (or higher number of transistors) cell. Cell 102 may include a static random access memory (SRAM) cell although other memory cell types may also be employed (e.g., DRAM, etc).

In the embodiment described herein, the cells 102 include a wordline enable signal (wle) that provides activation of a write wordline (wwl). In addition, a read wordline enable (rwle) provides activation for a read wordline (rwl) operation. The structure of FIG. 3 supports different wordlines to be employed for reading and writing operations. A read bitline (rbl) is also employed for reading memory values out from the bitlines.

Figure 4:
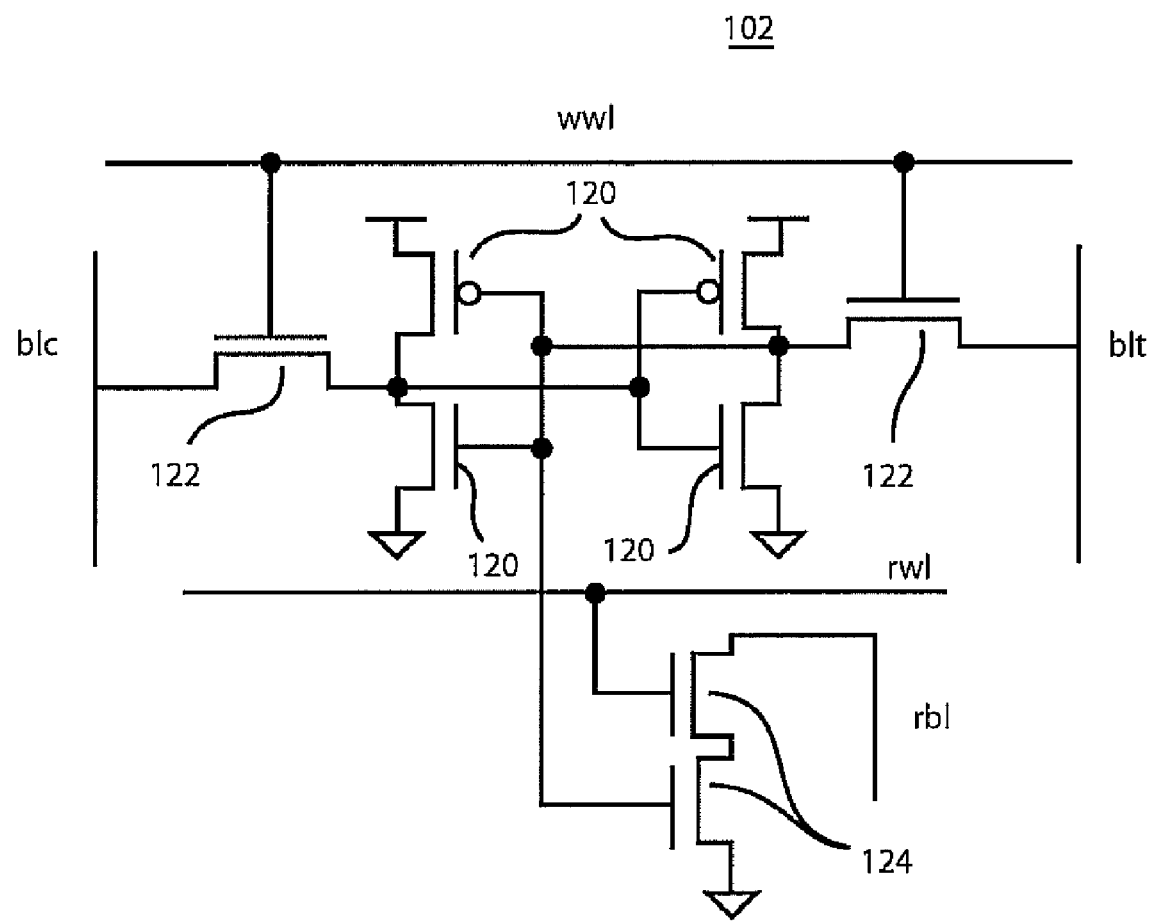
FIG. 4 is a schematic diagram of an exemplary 8T memory cell with separate write and read ports in accordance with one embodiment.

Referring to FIG. 4, a more detailed schematic diagram illustrative shows an 8T SRAM memory cell 102 with separate read and write wordlines. Cell 102 also includes separate write and read bitlines. Cell 102 includes four cross-coupled transistors 120. Two of the cross-coupled transistors are preferably NFETS while two of the transistors are preferably PFETS. Transistors 120 form latches for static memory storage.

Two access transistors 122 couple bitlines blc and blt to the cross-coupled transistors 120 based on a write wordline (wwl) for writing operations to the memory cell 102. Two read transistors 124 are employed for read operations in accordance with a read wordline (rwl). Data is read out of the read bitline (rbl). Note the number of transistors in FIG. 3 equals 8. However, different numbers of transistors are also contemplated and may benefit from the teachings in accordance with the present principles.

Figure 5:
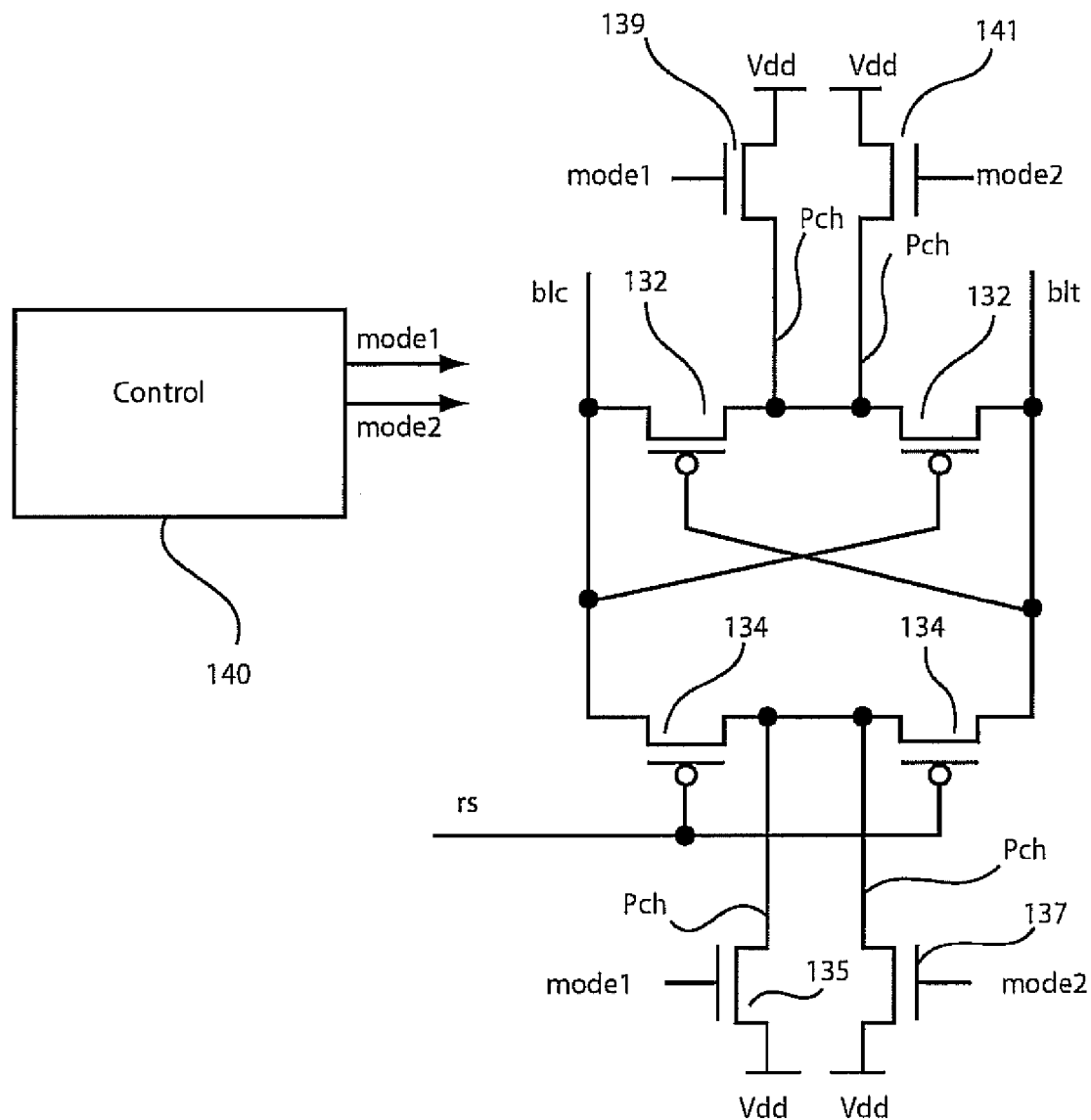
FIG. 5 is a schematic diagram of an exemplary precharge circuit in accordance with the present principles.

Referring to FIG. 5, a schematic diagram of precharge circuit 106 is illustratively shown in accordance with one embodiment. Precharge circuit 106 includes cross-coupled transistors 132. Transistors 132 are preferably included to provide stability by reducing noise on bitlines blc and blt. Transistors 134 are preferably controlled by a reset signal rs. When conducting, transistors 134 equalize the charge between bitlines blc and bit. Transistors 132 and 134 are shown as PFETS; however one skilled in the art would understand that NFETS may also be employed.

Precharge circuit 106 includes precharge transistors 135, 137, 139 and 141. The precharge transistors 135, 137, 139 and 141 may each include one of low, regular or high threshold voltage devices. Regular threshold voltage devices (RVTs) are devices which are formed using a standard dopant density for a given technology. The doping density is provided during the fabrication of the semiconductor device that the transistors are formed on. Low threshold voltage devices (LVTs) have a reduced dopant density, and high threshold voltage devices (HVTs) have an increased dopant density. In this way, the LVTs are turned on by a lower voltage than the RVTS, which are in turn turned on by a lower voltage than the HVTs. The different threshold voltages of the transistors 135, 137, 139 and 141 also represent an amount of voltage drop below Vdd that is provided. In this way, a different transistor or set of transistors (from the group of transistors 135, 137, 139 and 141) may be selected to adjust a precharge voltage, Pch. By way of example, LVTs may include a threshold voltage of less than 100 mV, RVTs may include a threshold voltage of between about 100-220 mV and HVTs may include a threshold voltage above 220 mv.

Transistors 135, 137, 139 and 141 are selectively activated (conducting) in accordance with a mode signal (mode). The mode signal is preferably an output voltage from a logic circuit or control circuit 140. The output voltage includes a predetermined magnitude configured to turn on one of more of the transistors 135, 137, 139 and 141. For example, if the output voltage (mode) is a low voltage only LVT transistors will be conducting and Vdd will be reduced by only a low voltage drop. If the output voltage is a regular voltage both LVTs and RVTs will be activated. The voltage drop will be the lower of the two threshold voltages. If the output voltage is a high voltage LVTs, RVTs and HVTs will be activated. The voltage drop will be the lower of the three threshold voltages.

The mode signals may provide a continuous voltage level, or may be programmable to provide different voltage levels to activate different devices 135, 137, 139, 141 at different times or in accordance with different operations. The devices are either turned on or off based on low or high voltage combinations. An "on" device leads to a voltage drop. The maximum drop of the group of devices dominates if two or more devices are turned on simultaneously due to some mode combination.

In one embodiment, transistors may be employed in pairs such that mode 1 may control an LVT 135 and an RVT 139. Furthermore, mode 2 may control an RVT 137 and a HVT 141. Other combinations may also be employed or different numbers of precharge transistors may be made available. In other embodiments, all transistors or pairs of transistors may include the same threshold voltage. For example, transistors 139 and 141 may both be HVTs or LVTs while transistors 135 and 137 may both be RVTs.

Alternately, the transistors 135, 137, 139, and 141 may each be separately programmed so that an input signal provides the needed threshold voltage for that specific transistor, only when that transistor is needed. Table 1 is a truth table that shows one implementation of a logic control for transistors 135, 137, 139, and 141. It should be understood that the precharge voltage (Pch) is employed in conjunction with the state of reset (rs) (for transistors 134) and/or the states of bitlines blc and blt (for transistors 132).

Transistors 135, 137, 139 and 141 are preferably controlled by a logic circuit 140. Logic circuit 140 provides timely control signals to the precharge circuit to control the precharge voltage (Pch). The logic circuit 140 may be triggered by such activities as a reset operation, a read operation, a write operation, etc. In one embodiment, the logic circuit 140 provides the functions as depicted in Table 1, although other logic operations may be employed.

TABLE 1

Truth Table for Precharge Voltage

| LVT | RVT | HVT | OPERATION | Pch |
|---|---|---|---|---|
| 0 | 0 | 0 | Column Float | Float |
| 1 | 0 | 0 | Column Precharge | Vdd-Vt$_{LVT}$ |
| 0 | 1 | 0 | Column precharge lowered by Vt$_{RVT}$ | Vdd-Vt$_{RVT}$ |
| 0 | 0 | 1 | Column precharge lowered by Vt$_{HVT}$ | Vdd-Vt$_{HVT}$ |

LVT, RVT and HVT in Table 1 are input values to that respective type of transistor. The transistor (LVT, RVT, HVT) conducts when the input value is "1" or "high". These devices are illustratively provided as NFETs; however, PFETs may also be employed. The operations shown in Table 1 include: column float (bitlines are floating), column precharge (bitlines are precharged to Vdd–Vt$_{LVT}$), column precharged at a lower voltage (Vdd–Vt$_{RVT}$) and column precharged at the lowest voltage (Vdd–Vt$_{HVT}$). As before if two or more devices are conducting at the same time the voltage drop is the Vdd—the lower of the Vts. Note that the precharge circuit is capable of floating "write bitlines", which is especially helpful during high frequency operation.

In accordance with the present principles, greater control of the bitline states is provided. The bitlines may be floating, partially floating or clamped. Floating the bitlines permits power to be reduced. When floating, the voltage to the bitlines is not maintained therefore power is conserved (Power=½((CV$^2$)). However, if left in a floating state for too long of a period, the floating bitlines may cause noise or be coupled to other nodes or lines. Partially floating the bitlines includes precharging the bitlines to a predetermined voltage and then letting the bitlines float. The voltage is not maintained after the precharge. Clamping the bitlines includes maintaining the bitlines at a predetermined voltage. Clamped or holding the bitline throughout a cycle at a predetermined voltage means the bitlines will not float during the cycle or during a bitline evaluation period.

The floating, partial floating and clamped states with respect to bitlines may be controlled by control logic 140 by altering pulse widths or other characteristics of the mode signals and enabling/disabling rs and other signals (e.g., the same programmable precharge scheme can be used for floating or clamping bitlines for different durations). For different operations in an integrated circuit, it may be advantageous to permit bitlines to float, partially float or be clamped. For example, for high frequency applications/cycles, it may be beneficial to float the bitlines whenever possible, while for slow cycles (i.e., very slow frequencies, programmable precharge can hold a precharge for unselected cells for a longer time and float for a shorter time). If the bitline floats for a long time (especially during slow cycles) then it may induce noise or couple with adjacent lines. Slow cycles may mean, for example, cycles below 500-600 MHz for a high frequency machine running above 2 Hz (below 10 MHz is considered DC (or extremely slow cycles).

Figure 6:
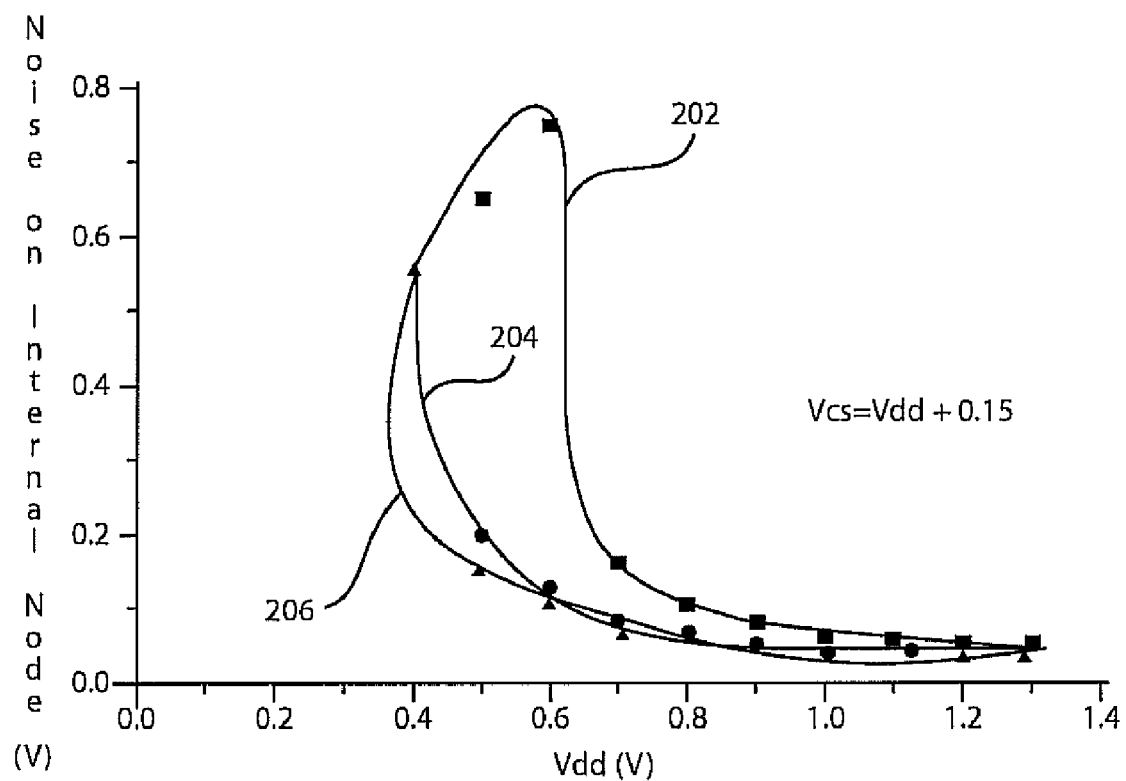
FIG. 6 is a plot of half-select stability showing 3 cases, Vdd, Vdd−Vt and Vdd−3Vt.

In accordance with the present principles, half-select stability increases significantly when a precharge circuit uses Vdd connected NFETs to achieve Vt drops. Sensitivity analysis was performed within 5σVt and the noise on the internal node was plotted as depicted in FIG. 6. In one embodiment, the voltage across access transistors (122) of the memory cell (102) is equalized so that a resultant potential difference across the access transistors (122) is not present when the memory cell's column is not selected. This reduces or eliminates half-select instability which could lead to errors in reading or writing data to the memory cells. In one embodiment, we have Vcs=Vdd+0.15V, making the cell stronger and more capable of fighting half select leakages (202). Half select may still be an issue however. In plots 204 and 206, improved Vmin is achieved as will be described.

Referring to FIG. 6, for a cycle time of 0.25 ns, noise on an internal node was plotted against the supply voltage, Vdd for a precharge to Vdd 202, a precharge to Vdd−Vt 204 and Vdd−3Vt (e.g., where HVT=3*LVT) 206. For Vdd−3Vt 206, Vmin (the minimum voltage needed for correct operation) improves by at least 200 mV. In addition, write and read delays remained unchanged using the precharge circuit in accordance with the present principles. (The write delay was measured from a bitline to an opposite node when the bitline flips.)

The precharge circuit for an 8-T SRAM cell prevents half-select mode operation. The precharge circuit is programmable with a variety of settings. Advantageously, the multi-transistor NFET/PFET scheme can be used in a source follower mode to lower the precharge voltage. Using this precharge circuit it is demonstrated that 8-T cell can operate with 64 cells on bit column with Vmin, e.g., close to Vdd=0.5 V (Vcs=0.65V), where Vcs is the memory cell supply voltage, and the write and read perf ormance is maintained.

Having described preferred embodiments of a half-select compliant memory cell precharge circuit and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A programmable precharge circuit, comprising:
   a plurality of transistors, each transistor having a different threshold voltage from other transistors of the plurality of transistors, each transistor being configured to connect a supply voltage to a node, the node being selectively coupled to bitlines in accordance with a memory operation wherein the node is coupled to the bitlines through cross-coupled transistors; and
   control logic configured to enable at least one of the plurality of transistors to provide a programmable precharge voltage to the node in accordance with a respective threshold voltage drop from the supply voltage of one of the plurality of transistors.

2. The precharge circuit as recited in claim 1, wherein the different threshold voltages for each transistor include one of low, regular or high threshold voltages.

3. The precharge circuit as recited in claim 1, wherein the node is coupled to the bitlines through reset transistors.

4. The precharge circuit as recited in claim 1, wherein the precharge circuit is employed to precharge bitlines in a static random access memory cell.

5. The precharge circuit as recited in claim 4, wherein the precharge circuit is employed to precharge bitlines for a write port of the static random access memory cell.

6. The precharge circuit as recited in claim 1, wherein one of the plurality of transistors is selected to control a voltage on the bitlines to eliminate half select errors.

7. The precharge circuit as recited in claim 1, wherein one of the plurality of transistors is selected to control a voltage on the bitlines to provide at least one of bitline floating, bitline partial floating and bitline clamping.

8. A programmable precharge circuit, comprising:
   a first transistor having a first threshold voltage configured to connect a supply voltage to a node, the node being selectively coupled to bitlines in accordance with a write operation;
   a second transistor having a second threshold voltage configured to connect the supply voltage to the node, the node being selectively coupled to the bitlines in accordance with the write operation wherein the node is coupled to the bitlines through cross-coupled transistors; and
   control logic configured to enable at least one of the first transistor and the second transistor to provide a programmable precharge voltage to the node in accordance with a respective threshold voltage drop from the supply voltage of one of the first and second threshold voltages.

9. The precharge circuit as recited in claim 8, wherein the first threshold voltage is greater than the second threshold voltage.

10. The precharge circuit as recited in claim 8, further comprising a third transistor having a third threshold voltage configured to connect the supply voltage to a second node, the second node being selectively coupled to the bitlines in accordance with the write operation.

11. The precharge circuit as recited in claim 10, wherein the third threshold voltage is greater than the first threshold voltage and the second threshold voltage.

12. The precharge circuit as recited in claim 8, wherein the node is coupled to the bitlines through reset transistors.

13. The precharge circuit as recited in claim 8, wherein the precharge circuit is employed to precharge bitlines in a static random access memory cell.

14. The precharge circuit as recited in claim 13, wherein the precharge circuit is employed to precharge bitlines for a write port of the static random access memory cell.

15. The precharge circuit as recited in claim 8, wherein one of the first and second transistors is selected to control a voltage on the bitlines to eliminate half select errors.

16. The precharge circuit as recited in claim 8, wherein one of the first and second transistors is selected to control a voltage on the bitlines to provide at least one of bitline floating, bitline partial floating and bitline clamping.

17. A method for reducing half select errors in a memory device, comprising:
   enabling at least one of a plurality of transistors to provide a programmable precharge voltage to a node in accordance with a threshold voltage drop from a supply voltage of a selected one of the plurality of transistors where each of the plurality of transistors includes a different threshold voltage; and
   selectively coupling the at least one of the plurality of transistors to bitlines in accordance with a memory operation to regulate a voltage on the bitlines to reduce half-select leakage in a memory cell, wherein the node is coupled to the bitlines through cross-coupled transistors.

18. The method as recited in claim 17, wherein the different threshold voltages for each transistor include one of low, regular or high threshold voltages.

19. The method as recited in claim 17, further comprising coupling the node to the bitlines through reset transistors.

20. The method as recited in claim 17, wherein enabling further comprises selecting one of the plurality of transistors to control a voltage on the bitlines to eliminate half select errors.

21. The method as recited in claim 17, wherein enabling further comprises selecting one of the plurality of transistors to control a voltage on the bitlines for at least one of floating a bitline, partially floating a bitline and clamping a bitline.

* * * * *